(12) United States Patent
Shinohara et al.

(10) Patent No.: US 8,692,311 B2
(45) Date of Patent: Apr. 8, 2014

(54) METHOD FOR MANUFACTURING SEMICONDUCTOR DEVICE

(75) Inventors: Hiroshi Shinohara, Mie-ken (JP); Daigo Ichinose, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 13/236,716

(22) Filed: Sep. 20, 2011

(65) Prior Publication Data

US 2012/0244673 A1 Sep. 27, 2012

(30) Foreign Application Priority Data

Mar. 25, 2011 (JP) ................................ 2011-067633

(51) Int. Cl.
*H01L 29/792* (2006.01)
(52) U.S. Cl.
USPC ............ 257/324; 257/329; 257/401; 438/287
(58) Field of Classification Search
USPC .......... 257/324, 326, 329, 401; 438/156, 206, 438/287
See application file for complete search history.

(56) References Cited

U.S. PATENT DOCUMENTS

| 2009/0090960 A1* | 4/2009 | Izumi et al. ................... 257/324 |
| 2010/0207195 A1* | 8/2010 | Fukuzumi et al. ............ 257/326 |
| 2010/0213537 A1* | 8/2010 | Fukuzumi et al. ............ 257/326 |

FOREIGN PATENT DOCUMENTS

| JP | 2006-13082 A | 1/2006 |
| JP | 2011-40533 A | 2/2011 |

OTHER PUBLICATIONS

Japanese Office Action Issued Jul. 26, 2013 in Patent Application No. 2011-067633 (with English translation).

* cited by examiner

*Primary Examiner* — Kimberly Rizkallah
*Assistant Examiner* — Errol Fernandes
(74) *Attorney, Agent, or Firm* — Oblon, Spivak, McClelland, Maier & Neustadt, L.L.P.

(57) ABSTRACT

According to one embodiment, a method is disclosed for manufacturing a semiconductor device. The method can include selectively implanting an impurity into a underlying layer containing silicon using a mask to form a boron-added region and an etched region. The boron-added region contains boron, and a boron concentration of the etched region is lower than a boron concentration in the boron added region. The method can include forming a pair of holes reaching the etched region in the stacked body including a plurality of layers of electrode layers. The method can include forming a depression part connected to a lower end of each of the pair of holes in the underlying layer by removing the etched region through the holes using an etching solution.

17 Claims, 12 Drawing Sheets

US 8,692,311 B2

METHOD FOR MANUFACTURING SEMICONDUCTOR DEVICE

CROSS-REFERENCE TO RELATED APPLICATION

This application is based upon and claims the benefit of priority from the prior Japanese Patent Application No. 2011-067633, filed on Mar. 25, 2011; the entire contents of which are incorporated herein by reference.

FIELD

Embodiments described herein relate generally to a method for manufacturing a semiconductor device.

BACKGROUND

A memory device is proposed in which memory cells are aligned three dimensionally by forming a memory hole in a stacked body having a plurality of electrode layers functioning as a control gate in a memory cell and a plurality of insulating layers stacked alternately, forming a charge storage film on a side wall of the memory hole, and then providing silicon serving as a channel in the memory hole.

Furthermore, in the memory device, a U-shaped memory string structure is proposed which has a pair of columnar parts extending in a stacking direction of the stacked body including the plurality of layers of electrode layers, and a joint part embedded in a back gate and linking the pair of columnar parts.

Before forming the stacked body including electrode layers, a depression part is formed in a underlying layer serving as a back gate, and a sacrifice film is embedded in the depression part. After that, the stacked body including electrode layers is formed on the underlying layer, and then a hole in the columnar parts is formed to thereby remove the sacrifice film in the depression part by etching through the hole. That is, in forming a U-shaped memory hole, there are included a process of forming a depression part, a process of embedding a sacrifice film in the depression part, and further a process of flattening a surface of a underlying layer by removing a sacrifice film other than the depression part.

DETAILED DESCRIPTION

Figure 1:
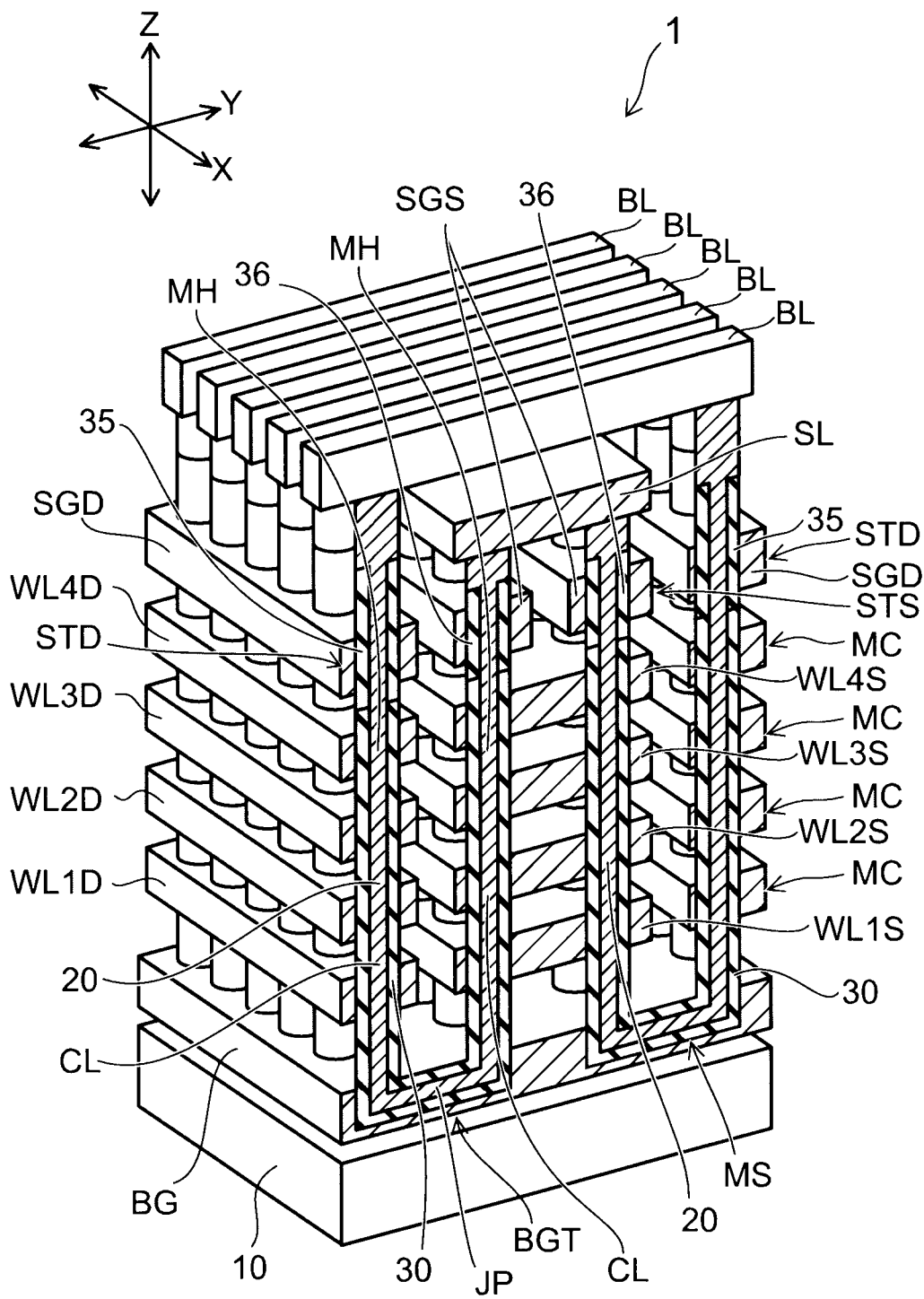
FIG. 1 is a schematic perspective view of a semiconductor device of an embodiment.

According to one embodiment, a method is disclosed for manufacturing a semiconductor device. The method can include selectively implanting an impurity into a underlying layer containing silicon using a mask to form a boron-added region and an etched region. The boron-added region contains boron, and a boron concentration of the etched region is lower than a boron concentration in the boron added region. The method can include forming a stacked body including a plurality of layers of electrode layers on the underlying layer. The method can include forming a pair of holes reaching the etched region in the stacked body. The method can include forming a depression part connected to a lower end of each of the pair of holes in the underlying layer by removing the etched region through the holes using an etching solution. The method can include forming an insulating film including a charge storage film on a side wall of the holes and on an inner wall of the depression part. In addition, the method can include forming a channel body inside the insulating film.

Embodiments will be described hereinafter with reference to the accompanying drawings. In the drawings, same components similar to those are marked with like reference numerals.

FIG. 1 is a schematic perspective view of a memory cell array in a semiconductor device 1 of an embodiment. In FIG. 1, in order to facilitate visualization of the drawing, insulating parts other than insulating films formed on inner walls of memory holes MH are omitted from the illustration.

Figure 6A:
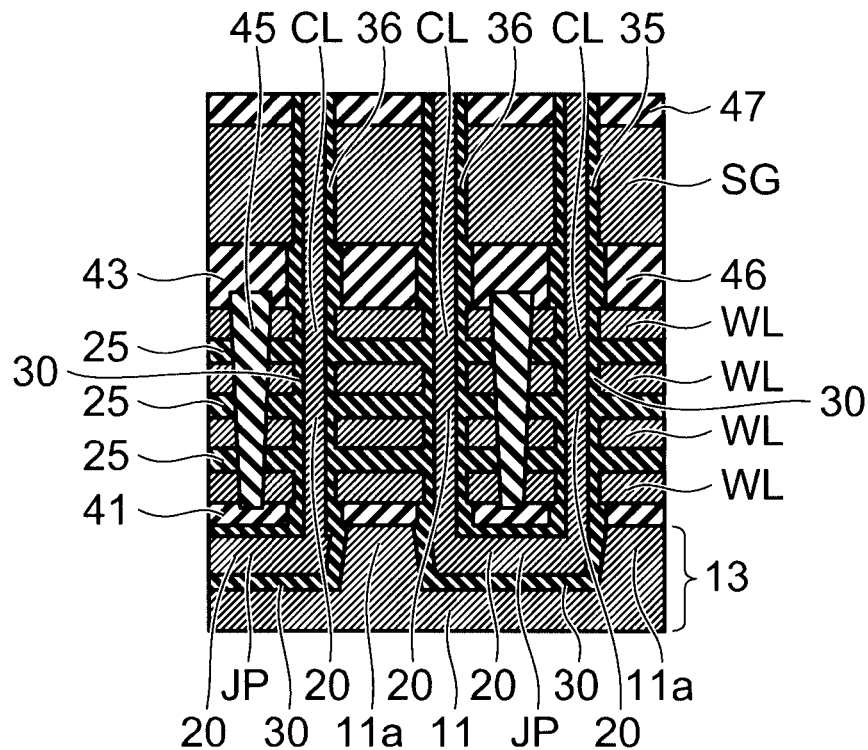
Figure 6B:
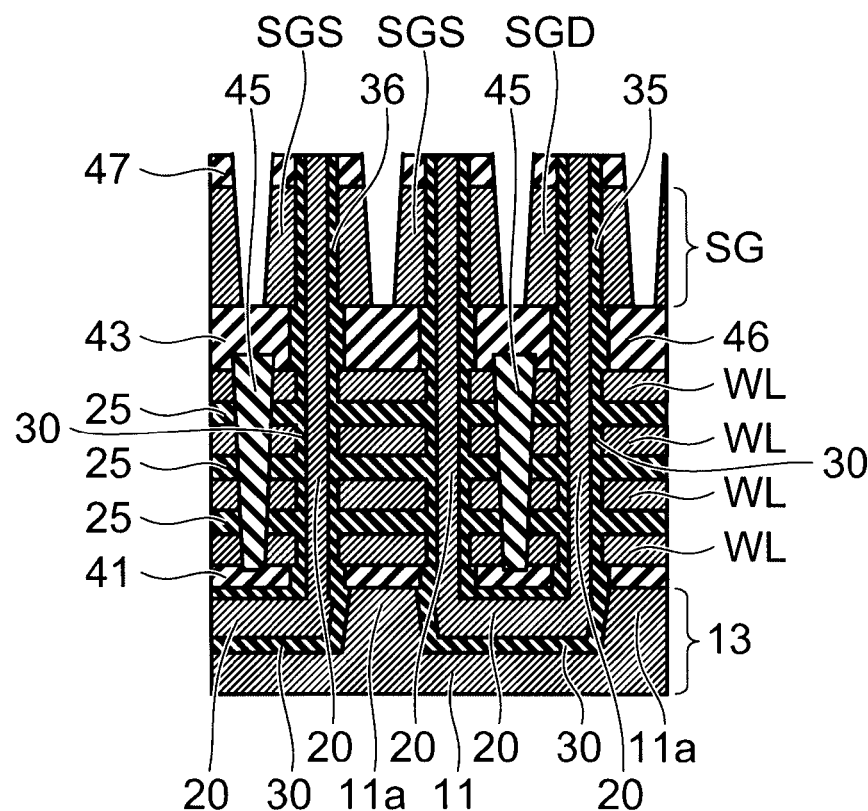

FIG. 6B is a schematic cross-sectional view of the same memory cell array.

Figure 2:
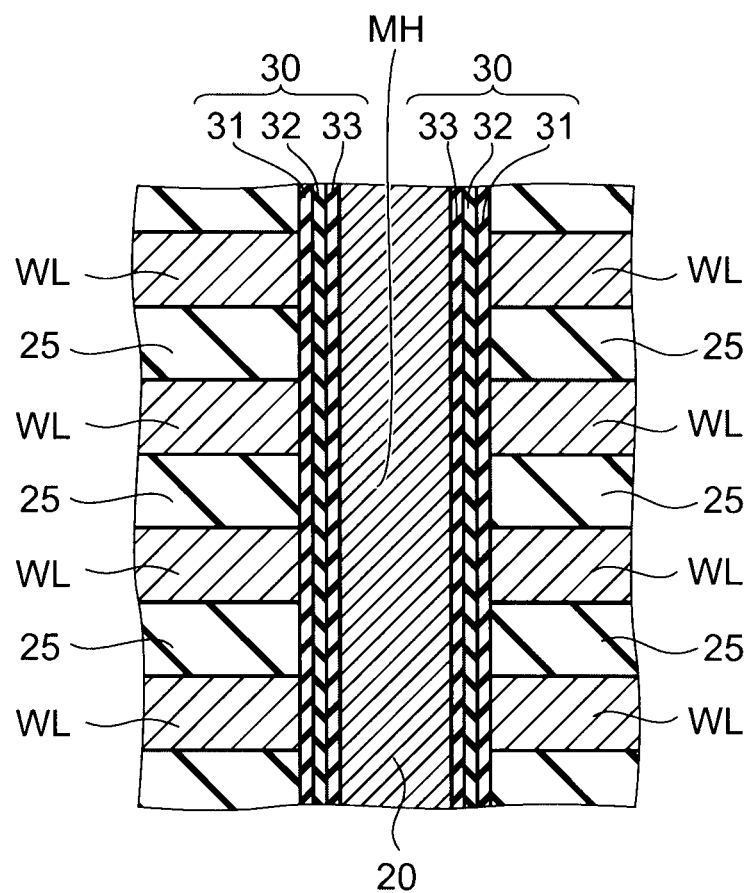
FIG. 2 is an enlarged cross-sectional view of a relevant part of the semiconductor device of the embodiment.

FIG. 2 is an enlarged cross-sectional view of a part in which memory cells are provided in FIGS. 1 and 6B.

Furthermore, in FIG. 1, for convenience of explanation, an XYZ Cartesian coordinate system is introduced. In this coordinate system, two directions which are parallel to a major surface of a substrate 10 and also orthogonal to each other are defined as an X direction and a Y direction, and a direction which is orthogonal to both of these X direction and Y direction is defined as a Z direction.

In FIG. 1, on the substrate 10, a back gate BG is provided via an insulating layer not shown. The back gate BG is, for example, a silicon layer having impurities added thereto and conductivity. In FIG. 6B, a boron-added silicon layer 11 corresponds to the back gate BG.

On the back gate BG, a plurality of insulating layers 25 (shown in FIGS. 2 and 6B) and a plurality of electrode layers WL1D, WL2D, WL3D, WL4D, WL1S, WL2S, WL3S, and WL4S are stacked alternately on each other.

The electrode layer WL1D and the electrode layer WL1S are provided at a same level and represent electrode layers of a first layer from the bottom. The electrode layer WL2D and the electrode layer WL2S are provided at a same level and represent electrode layers of a second layer from the bottom. The electrode layer WL3D and the electrode layer WL3S are provided at a same level and represent electrode layers of a third layer from the bottom. The electrode layer WL4D and the electrode layer WL4S are provided at a same level and represent electrode layers of a fourth layer from the bottom.

The electrode layer WL1D and the electrode layer WL1S are divided in the Y direction. The electrode layer WL2D and the electrode layer WL2S are divided in the Y direction. The electrode layer WL3D and the electrode layer WL3S are divided in the Y direction. The electrode layer WL4D and the electrode layer WL4S are divided in the Y direction.

Between the electrode layer WL1D and the electrode layer WL1S, between the electrode layer WL2D and the electrode layer WL2S, between the electrode layer WL3D and the electrode layer WL3S, and between the electrode layer WL4D and the electrode layer WL4S, an insulator 45 shown in FIG. 6B is provided.

The electrode layers WL1D, WL2D, WL3D, and WL4D are provided between the back gate BG and a drain side selection gate SGD. The electrode layers WL1S, WL2S, WL3S, and WL4S are provided between the back gate BG and a source side selection gate SGS.

The number of layers in the electrode layers WL1D, WL2D, WL3D, WL4D, WL1S, WL2S, WL3S, and WL4S is arbitrary and is not limited to four layers illustrated in FIG. 1. In the explanation below, there is a case where each of the electrode layers WL1D, WL2D, WL3D, WL4D, WL1S, WL2S, WL3S, and WL4S are also simply referred to as electrode layers WL.

The electrode layers WL are, for example, a silicon layer having impurities added thereto and conductivity. The insulating layers 25 are, for example, a tetraethoxysilane (TEOS) layer including silicon oxide.

On the electrode layer WL4D, the drain side selection gate SGD is provided via an insulating layer not shown. The drain side selection gate SGD is, for example, a silicon layer having impurities added thereto and conductivity.

On the electrode layer WL4S, the source side selection gate SGS is provided via an insulating layer not shown. The source side selection gate SGS is, for example, a silicon layer having impurities added thereto and conductivity.

The drain side selection gate SGD and the source side selection gate SGS are divided in the Y direction. In the explanation below, there is a case where the drain side selection gate SGD and the source side selection gate SGS are referred to simply as selection gates SG without distinction.

On the source side selection gate SGS, a source line SL is provided via an insulating layer not shown. The source line SL is a metal layer, or a silicon layer having impurities added thereto and conductivity.

On the drain side selection gate SGD and the source line SL, a plurality of bit lines BL are provided via an insulating layer not shown. Each bit line BL extends in the Y direction.

In the back gate BG and the stacked body on the back gate BG, a plurality of U-shaped memory holes MH are formed. In the electrode layers WL1D to WL4D and the drain side selection gate SGD, a hole penetrating them and extending in the Z direction is formed. In the electrode layers WL1S to WL4S and the source side selection gate SGS, a hole penetrating them and extending in the Z direction is formed. The pair of holes extending in the Z direction are connected via a depression part formed in the back gate BG and configure the U-shaped memory hole MH.

Inside the memory hole MH, a channel body 20 is provided in a U shape. The channel body 20 is, for example, a silicon film. Between the channel body 20 and the inner wall of the memory hole MH, an insulating film 30 is provided.

Between the channel body 20 and the drain side selection gate SGD, a gate insulating film 35 is provided. Between the channel body 20 and the source side selection gate SGS, a gate insulating film 36 is provided.

The structure is not limited to a structure in which the entire inside of the memory hole MH is filled with the channel body 20, and may also be a structure in which the channel body 20 is formed to leave a hollow on central axis side of the memory hole MH and an insulator is embedded in the internal hollow.

The insulating film 30 has, for example, an Oxide-Nitride-Oxide (ONO) structure in which a pair of silicon oxide films sandwich a silicon nitride film. As shown in FIG. 2, between each electrode layer WL and the channel body 20, from the electrode layer WL side in order, a first insulating film 31, a charge storage film 32, and a second insulating film 33 are provided. The first insulating film 31 contacts the electrode layer WL, the second insulating film 33 contacts the channel body 20, and between the first insulating film 31 and the second insulating film 33, the charge storage film 32 is provided.

The channel body 20 functions as a channel in a transistor configuring the memory cell, the electrode layers WL function as control gates, and the charge storage film 32 functions as a data memory layer that stores a charge injected from the channel body 20. That is, in an intersection of the channel body 20 and each electrode layer WL, the memory cell is formed in a structure of surrounding the circumference of the channel with the control gate.

The semiconductor device 1 of an embodiment is a non-volatile semiconductor memory device which can electrically freely perform erase and writing of data and can maintain memory contents even when turning off the power source.

The memory cell is a memory cell in, for example, a charge trapping structure. The charge storage film 32 has a large number of traps that trap a charge (electron) and is, for example, a silicon nitride film. The second insulating film 33 is, for example, a silicon oxide film and becomes a potential barrier when a charge is injected to the charge storage film 32 from the channel body 20 or when a charge stored in the charge storage film 32 diffuses into the channel body 20. The first insulating film 31 is, for example, a silicon oxide film and prevents the charge stored in the charge storage film 32 from diffusing into the electrode layers WL.

The drain side selection gate SGD, the channel body 20, and the gate insulating film 35 between them configure a drain side selection transistor STD. The channel body 20 above the drain side selection transistor STD is connected to the bit lines BL.

The source side selection gate SGS, the channel body 20, and the gate insulating film 36 between them configure a source side selection transistor STS. The channel body 20 above the source side selection transistor STS is connected to the source line SL.

The back gate BG, the channel body 20 provided in the back gate BG, and the insulating film 30 configure a back gate transistor BGT.

Between the drain side selection transistor STD and the back gate transistor BGT, a plurality of memory cells are provided using each of the electrode layers WL4D to WL1D as a control gate. Similarly, also between the back gate transistor BGT and the source side selection transistor STS, a plurality of memory cells are provided using each of the electrode layers WL1S to WL4S as a control gate.

The plurality of memory cells, the drain side selection transistor STD, the back gate transistor BGT, and the source side selection transistor STS are connected in series through the channel body 20 to configure one U-shaped memory string MS.

The one memory string MS has a pair of columnar parts CL, extending in the stacking direction of the stacked body including the plurality of electrode layers WL, and a joint part JP, embedded in the back gate BG and linking the pair of columnar parts CL. Since there are a plurality of such memory strings MS aligned in the X direction and in the Y direction, the plurality of memory cells are provided three dimensionally in the X direction, in the Y direction, and in the Z direction.

The plurality of memory strings MS are provided in a memory cell array region on the substrate 10. On, for example, the periphery of the memory cell array region on the substrate 10, a peripheral circuit which controls the memory cell array is provided.

Next, a method for manufacturing the semiconductor device 1 will be explained. In the explanation below, a method for forming the memory cell array will be explained.

First Embodiment

FIGS. 3A to 6B show a first embodiment of a method for manufacturing the semiconductor device 1.

Figure 3A:
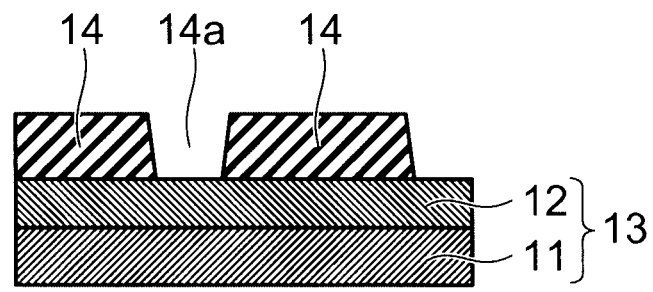
FIG. 3A to FIG. 6B are schematic cross-sectional views showing a method for manufacturing a semiconductor device according to a first embodiment.

On the substrate 10, a underlying layer 13 shown in FIG. 3A is formed. The underlying layer 13 includes the boron-added silicon layer 11 in which boron (B) is added to (doped into) a silicon layer and a non-doped silicon layer 12 provided thereon without intentionally added impurities.

A resist 14 is formed on the non-doped silicon layer 12 as an ion implantation mask described later. The resist 14 has an opening 14a patterned by photolithography and formed selectively.

Then, through the use of the resist 14 as a mask, boron is implanted into the underlying layer 13 by an ion implantation method. The boron is selectively implanted in a region exposed to the opening 14a in the non-doped silicon layer 12.

Figure 3B:
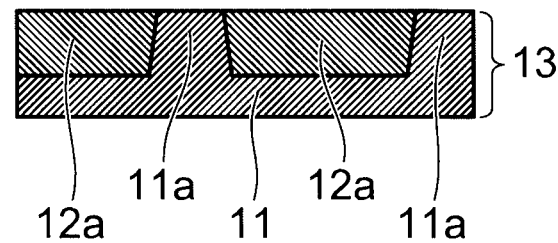

Thereby, as shown in FIG. 3B, the region into which the boron has been implanted in the non-doped silicon layer 12 becomes a boron-added region 11a containing boron. In the non-doped silicon layer 12, a region into which boron has not been implanted by being covered with the resist 14 remains to be the region of non-doped silicon, which becomes an etched region 12a. The boron-added region 11a and the boron-added silicon layer 11 have boron concentrations higher than a boron concentration in the etched region 12a.

The boron-added region 11a is formed all over the thickness direction of the non-doped silicon layer 12 and is connected to the boron-added silicon layer 11. Side walls of the etched region 12a are adjacent to the boron-added region 11a, and a bottom portion of the etched region 12a is in contact with the boron-added silicon layer 11.

Figure 3C:
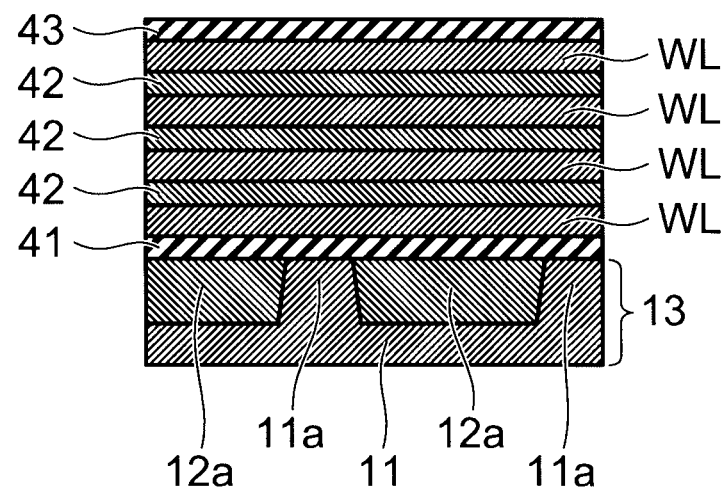

Next, as shown in FIG. 3C, after forming an insulating film 41 on the underlying layer 13, a stacked body including the plurality of layers of electrode layers WL is formed thereon.

The insulating film 41 is, for example, a silicon oxide film having a film thickness sufficient for securing the breakdown voltage between the boron-added silicon layer 11 serving as the back gate BG and the lowermost layer of the electrode layers WL.

The electrode layers WL are silicon layers having, for example, boron-added thereto and conductivity. Furthermore, between the electrode layers WL, non-doped silicon layers 42 are formed. The non-doped silicon layers 42 are finally replaced with the insulating layers 25 shown in FIG. 2 in a process described later. The non-doped silicon layers 42 have a film thickness sufficient for securing the breakdown voltage between the electrode layers WL. On the uppermost layer of the electrode layers WL, an insulating film 43 (for example, a silicon oxide film) is formed.

Figure 4A:
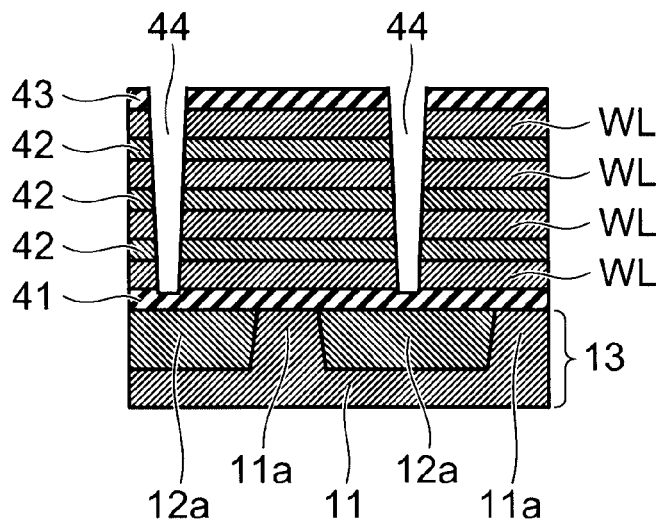
Figure 4B:
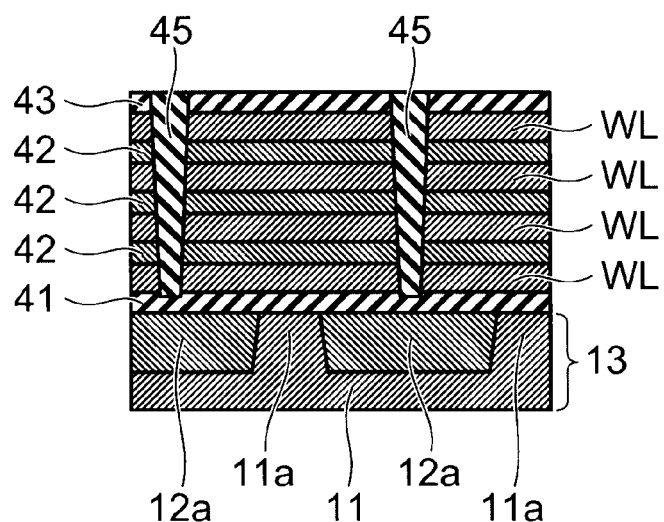

Next, as shown in FIG. 4A, the stacked body is divided by photolithography and etching to thereby form grooves 44 reaching the insulating film 41. The grooves 44 are positioned approximately at the center in the width direction (Y direction in FIG. 1) of the etched region 12a. After that, as shown in FIG. 4B, the grooves 44 are filled with an insulating film 45. The insulating film 45 is, for example, a silicon nitride film.

Figure 4C:
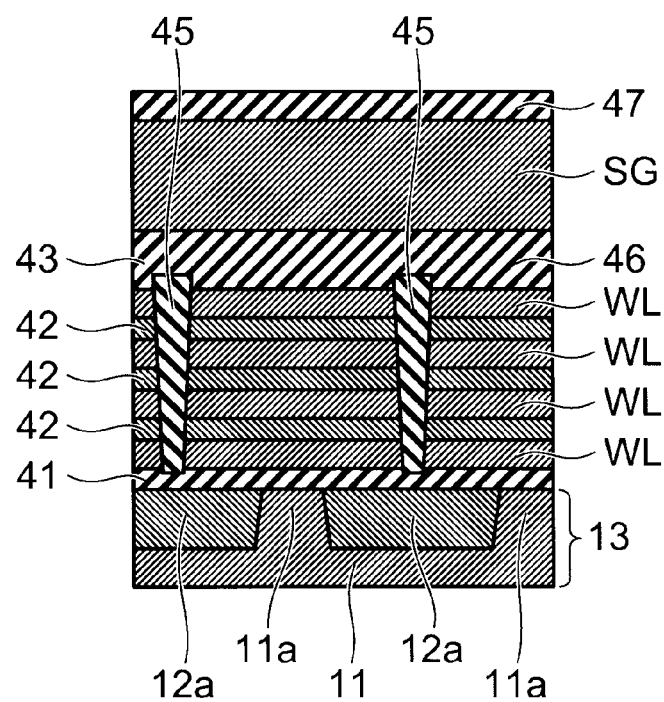

After filling the grooves 44 with the insulating film 45, the insulating film 43 is exposed by overall etching. On the insulating film 43, as shown in FIG. 4C, an insulating film 46 is formed. Furthermore, on the insulating film 46, the selection gate SG is formed.

The insulating film 46 is, for example, a silicon oxide film having a film thickness sufficient for securing the breakdown voltage between the uppermost layer of the electrode layers WL and the selection gate SG. The selection gate SG is a silicon layer having, for example, boron-added thereto and conductivity. On the selection gates SG, an insulating film 47 (for example, a silicon oxide film) for protecting the selection gate SG is formed.

Figure 5A:
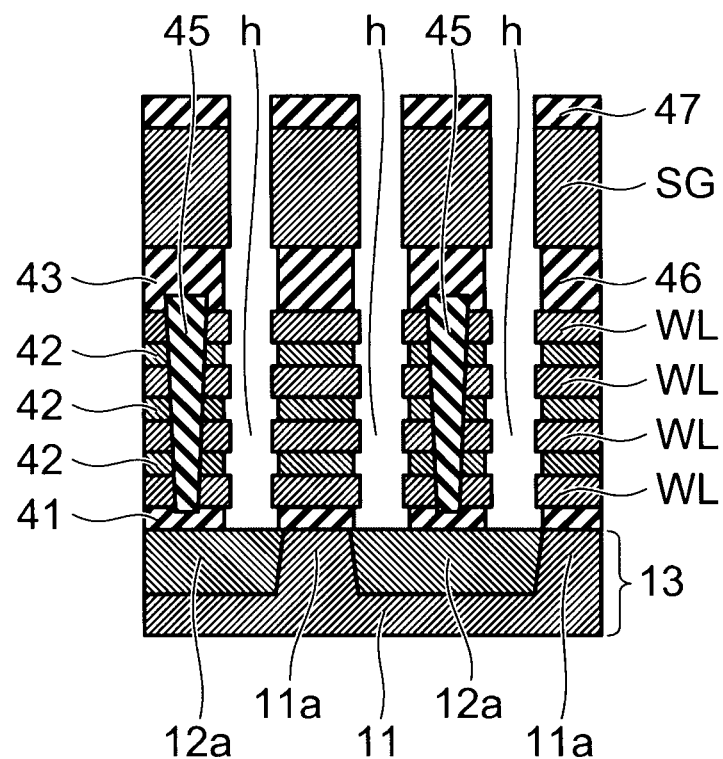

Next, as shown in FIG. 5A, holes h are formed in the stacked body on the underlying layer 13. The holes h are formed by, for example, a Reactive Ion Etching (RIE) method through the use of a mask not shown. Lower ends of the holes h reach the etched region 12a and the etched region 12a is exposed to the bottom portions of the holes h. So as to sandwich the insulating film 45 positioned approximately at the center of the etched region 12a, a pair of holes h are positioned on the etched region 12a.

Next, the etched region 12a is removed by wet etching. As an etching solution at this time, an alkaline chemical solution, such as a KOH (potassium hydroxide) solution, for example, is used.

Figure 5B:
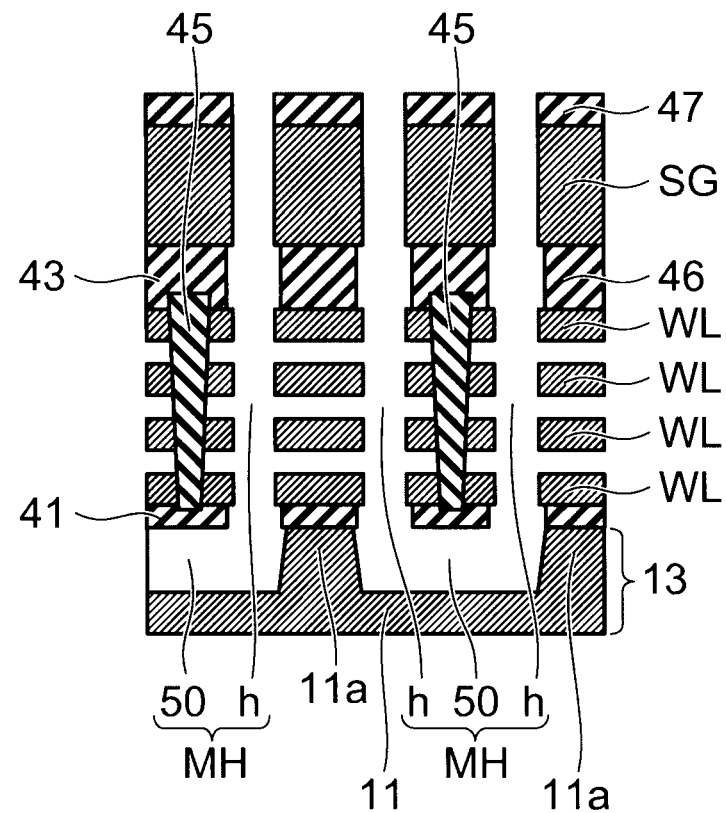

Thereby, the etched region 12a is removed as shown in FIG. 5B. Furthermore, at this time, the non-doped silicon layers 42 of non-doped silicon, same as the etched region 12a, are also removed.

During this etching, the boron-added silicon layer 11, the boron-added region 11a, the electrode layers WL, and the selection gate SG are not removed, which contain boron with concentrations higher than boron concentrations of the etched region 12a and the non-doped silicon layers 42.

The etching rate of the alkaline chemical solution for silicon depends on the concentration of boron doped into the silicon. In particular, when the boron concentration becomes not less than $10^{20}$ atom/cm$^3$, the etching rate decreases rapidly and becomes a several tenth of the etching rate when the boron concentration is not more than $10^{19}$ atom/cm$^3$. That is, an etching rate of the alkaline chemical solution decreases in the case of silicon containing a high concentration of boron more than in the case of silicon not containing boron or having a low concentration of boron.

Accordingly, in order to selectively remove the etched region 12a while firmly suppressing the etching in the boron-added silicon layer 11 and the boron-added region 11a, it is preferred that the boron concentrations in the boron-added silicon layer 11 and the boron-added region 11a are not less than $10^{20}$ atom/cm$^3$. Similarly, in order to firmly suppress the etching in the electrode layers WL and the selection gate SG, it is also preferred that the boron concentrations in them are not less than $10^{20}$ atom/cm$^3$.

By the removal of the etched region 12a, as shown in FIG. 5B, depression parts 50 are formed in the underlying layer 13. The circumference of the depression parts 50 is surrounded by the boron-added region 11a, and under the depression parts 50, the boron-added silicon layer 11 exists.

Per one depression part 50, a pair of holes h are connected. That is, each lower end of a pair of holes h is connected to one common depression part 50 to form one U-shaped memory hole MH.

After forming the memory holes MH, as shown in FIG. 6A, the insulating layers 25 are formed between the electrode layers WL, and further on inner walls of the memory holes MH, the insulating films 30 including the charge storage film 32 described above are formed. Furthermore, on side walls of the memory holes MH in which the selection gate SG is exposed, the gate insulating films 35 and 36 are formed.

Moreover, inside the insulating films 30 and the gate insulating films 35 and 36 in the memory holes MH, a silicon film as the channel body 20 is formed. After that, by overall etching, a surface of the insulating film 47 is exposed.

Next, by photolithography and etching, grooves reaching the insulating film 46 are formed in the insulating film 47 and the selection gate SG, as shown in FIG. 6B. Thereby, the selection gate SG is divided into the drain side selection gates SGD and the source side selection gates SGS. Furthermore, after that, a contact electrode not shown, the source line SL and the bit lines BL shown in FIG. 1, and the like are formed.

Here, with reference to FIGS. 12A to 12D, a method for forming depression parts of memory holes MH in comparative example will be explained.

Figure 12A:
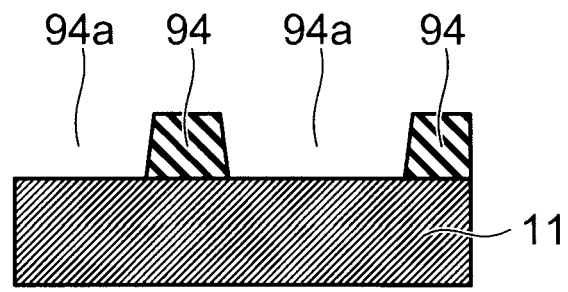
FIGS. 12A to 12D are schematic cross-sectional views showing a method for manufacturing a semiconductor device of a comparative example.

First, as shown in FIG. 12A, a resist 94 is formed on a boron-added silicon layer 11 as a underlying layer. The resist 94 has openings 94a patterned and selectively formed.

Figure 12B:
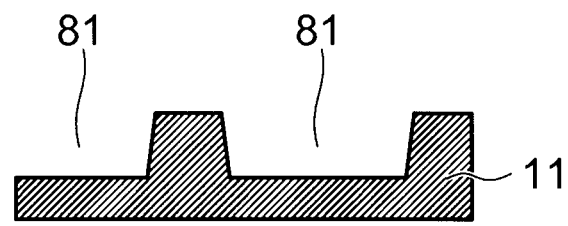

Next, through the use of the resist 94 as a mask, the boron-added silicon layer 11 is dry etched selectively. Thereby, as shown in FIG. 12B, depression parts 81 are formed in the boron-added silicon layer 11.

Figure 12C:
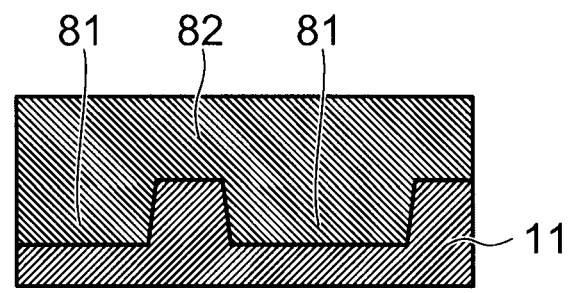
Figure 12D:
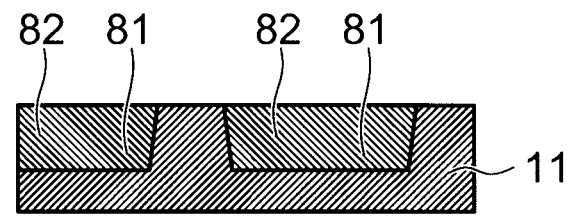

Next, as shown in FIG. 12C, non-doped silicon is embedded in the depression parts 81 as a sacrifice film 82. After that, by overall etching the sacrifice film 82, a surface of the boron-added silicon layer 11 between the depression part 81 and the depression part 81 is exposed as shown in FIG. 12D.

Since then, the processes since FIG. 3C described above proceed similarly, and a stacked body including the plurality of layers of electrode layers WL is formed, and further in the stacked body, holes h reaching the sacrifice film 82 are formed.

After that, by wet etching using an alkaline chemical solution, the sacrifice film 82 is removed through the holes h. Thereby, a U-shaped memory hole MH is formed where the depression part 81 from which the sacrifice film 82 is removed and a pair of holes h reaching the depression parts 81 are connected.

In the processes of this comparative example, before forming the stacked body including the electrode layers WL on the underlying layer, processes are carried out, such as formation of the depression parts 81 by dry etching the underlying layer, film formation of the sacrifice film 82, and flattening of a surface of the underlying layer by removing the unnecessary sacrifice film 82.

Furthermore, in the process of exposing the surface of the boron-added silicon layer 11 by etching the unnecessary sacrifice film 82, due to the difference in the etching rates for non-doped silicon, which is the sacrifice film 82, and for the boron-added silicon layer 11, the surface of the underlying layer does not become flat, and after that, a difference in level is easily formed in the stacked body to be stacked on the underlying layer.

In contrast, according to the embodiment, as described above with reference to FIGS. 3A and 3B, by selective ion implantation, two regions (the boron-added region 11a and the etched region 12a) with relatively different boron concentrations, that is, relatively different etching rates are made separately in the underlying layer 13. The processes are unnecessary, such as dry etching of the underlying layer, film formation of the sacrifice film, and flattening of the underlying layer by removing the unnecessary sacrifice film. This enables the embodiment to decrease the number of processes for cost reduction.

Furthermore, in the embodiment, since there is no process of removing the unnecessary sacrifice film, the underlying layer surface does not leave a difference in level and no difference in level is formed in the electrode layers WL stacked thereon. This allows the stabilization of electrical properties of the memory cell transistors.

Second Embodiment

Next, FIGS. 7A to 8B show a second embodiment of a method for manufacturing the semiconductor device 1.

Figure 7A:
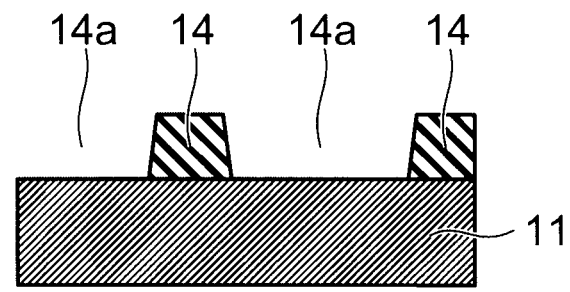
FIG. 7A to FIG. 8B are schematic cross-sectional views showing a method for manufacturing a semiconductor device according to a second embodiment.

On the substrate 10, as a underlying layer, the boron-added silicon layer 11 shown in FIG. 7A is formed. On the boron-added silicon layer 11, as an ion implantation mask, the resist 14 is formed. The resist 14 has openings 14a patterned by photolithography and formed selectively.

Then, through the use of the resist 14 as a mask, phosphorus (P) is implanted into the boron-added silicon layer by an ion implantation method. The phosphorus is implanted selectively in a region exposed to the openings 14a in the boron-added silicon layer 11.

Figure 7B:
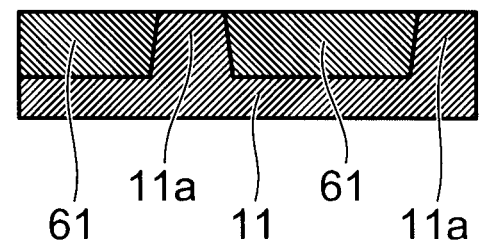

Thereby, as shown in FIG. 7B, the region into which the phosphorus is implanted in the boron-added silicon layer 11 becomes an etched region 61 with a boron concentration decreased relatively more than a boron concentration in the boron-added silicon layer 11. In the boron-added silicon layer 11, a region into which phosphorus is not implanted by being covered with the resist 14 becomes the boron-added region 11a. The boron-added region 11a and the boron-added silicon layer 11 have boron concentrations higher than a boron concentration in the etched region 61 into which the phosphorus is implanted.

The etched region 61 is formed not all over the thickness direction of the boron-added silicon layer 11, and under the etched region 61, the boron-added silicon layer 11 exists. The boron-added region 11a surrounds the circumference of the etched region 61.

Figure 7C:
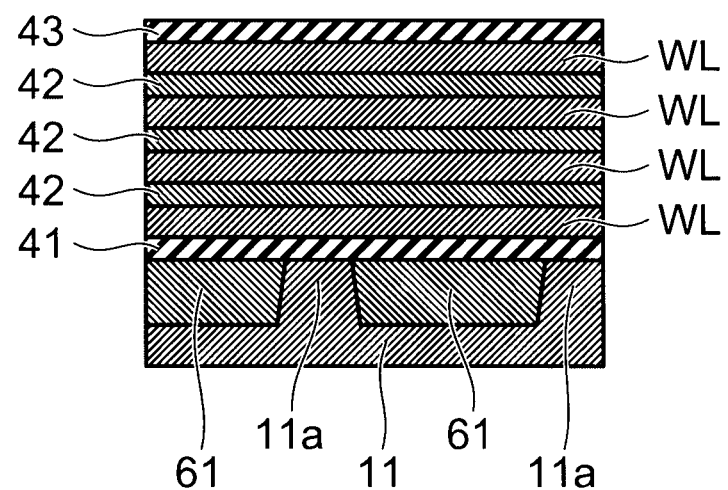

Next, as shown in FIG. 7C, after forming the insulating film 41 on the etched region 61 and the boron-added silicon layer 11, a stacked body including a plurality of layers of electrode layers WL is formed thereon.

Figure 8A:
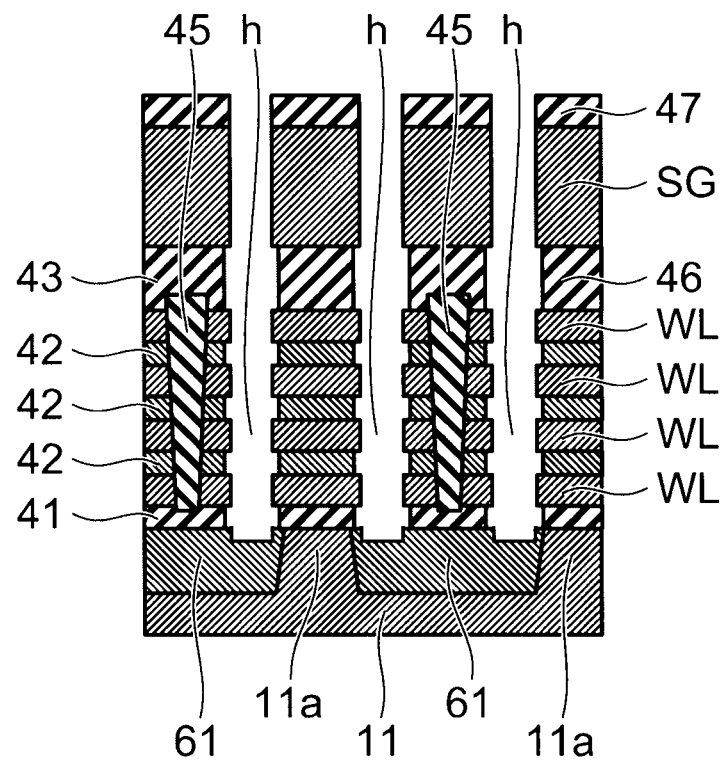

Since then, processes proceed in the same way as in the first embodiment, and as shown in FIG. 8A, holes h are formed in the stacked body including the electrode layers WL. Lower ends of the holes h reach the etched region 61 and the bottom portions of the holes h are exposed to the etched region 61. So as to sandwich the insulating film 45 positioned approximately at the center of the etched region 61, a pair of holes h are positioned on the etched region 61.

Next, the etched region 61 is removed by wet etching. As an etching solution at this time, an alkaline chemical solution, such as a KOH (potassium hydroxide) solution, for example, is used.

Figure 8B:
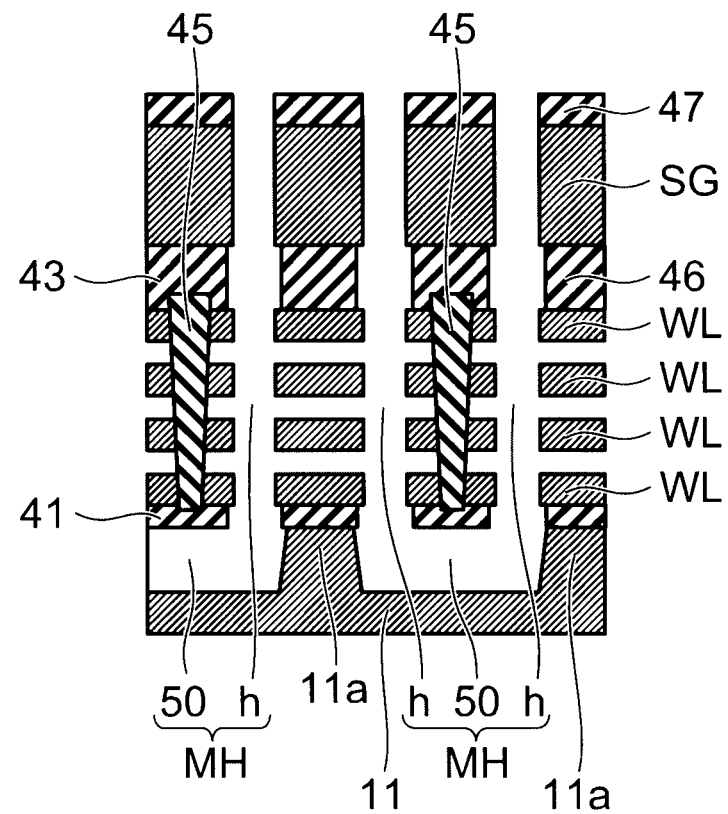

Thereby, the etched region 61 is removed as shown in FIG. 8B. The etched region 61 into which phosphorus is implanted and the non-doped silicon layers 42 have boron concentrations lower than boron concentrations in the boron-added region 11a and the boron-added silicon layer 11. Due to the difference in the boron concentrations, the etched region 61 and the non-doped silicon layers 42 are removed selectively. The boron-added silicon layer 11, the boron-added region 11a, the electrode layers WL, and the selection gate SG, which are relatively higher in the boron concentrations, are not removed.

In order to selectively remove the etched region 61 while firmly suppressing the etching in the boron-added silicon layer 11 and the boron-added region 11a, it is preferred that the boron concentrations in the boron-added silicon layer 11 and the boron-added region 11a are not less than $10^{20}$ atom/$cm^3$, and it is also preferred that the phosphorus concentration in the etched region 61 is not less than $10^{20}$ atom/$cm^3$.

By the removal of the etched region 61, as shown in FIG. 8B, depression parts 50 are formed in the boron-added silicon layer 11. Per one depression part 50, a pair of holes h are connected. That is, each lower end of a pair of holes h is connected to one common depression part 50 to form one U-shaped memory hole MH. After forming the memory holes MH, processes similar to the first embodiment proceed.

Also in the second embodiment, as shown in FIGS. 7A and 7B, by selective ion implantation, two regions (the boron-added region 11a and the etched region 61) with relatively different boron concentrations, that is, relatively different etching rates are made separately in the underlying layer. Therefore, the processes are unnecessary, such as dry etching of the underlying layer, film formation of the sacrifice film, and flattening of the underlying layer by removing the unnecessary sacrifice film, which allows the decrease in the number of processes for cost reduction.

Furthermore, also in the second embodiment, since there is no process of removing the unnecessary sacrifice film, the underlying layer surface does not leave a difference in level and no difference in level is formed in the electrode layers WL stacked thereon. This allows the stabilization of electrical properties of the memory cell transistors.

Third Embodiment

Next, FIGS. 9A to 11B show a third embodiment of a method for manufacturing the semiconductor device 1.

Figure 9A:
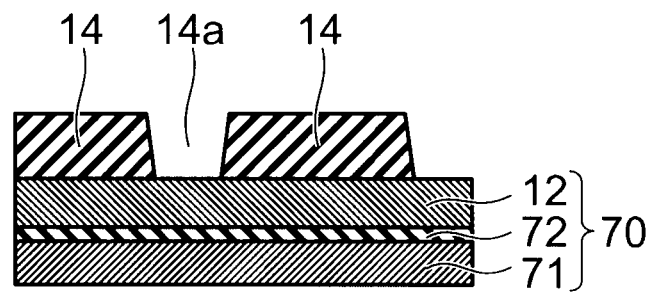
FIG. 9A to FIG. 11B are schematic cross-sectional views showing a method for manufacturing a semiconductor device according to a third embodiment.

On the substrate 10, an underlying layer 70 shown in FIG. 9A is formed. The underlying layer 70 includes a silicon layer 71, an insulating layer 72 provided on the silicon layer 71, and the non-doped silicon layer 12 provided on the insulating layer 72. The insulating layer 72 is, for example, a silicon oxide layer.

On the non-doped silicon layer 12, as an ion implantation mask, the resist 14 is formed. The resist 14 has openings 14a patterned by photolithography and formed selectively.

Then, through the use of the resist 14 as a mask, boron is implanted into the non-doped silicon layer 12 by an ion implantation method. The boron is implanted selectively in a region exposed to the openings 14a in the non-doped silicon layer 12.

Figure 9B:
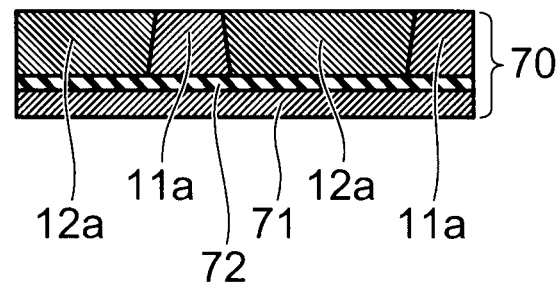

Thereby, as shown in FIG. 9B, the region into which the boron has been implanted in the non-doped silicon layer 12 becomes the boron-added region 11a containing boron. In the non-doped silicon layer 12, a region into which boron has not been implanted by being covered with the resist 14 remains to be the region of non-doped silicon, which becomes an etched region 12a. The boron-added region 11a has a boron concentration higher than a boron concentration in the etched region 12a.

The boron-added region 11a is formed all over the thickness direction of the non-doped silicon layer 12 and the bottom portion of the boron-added region 11a reaches the insulating layer 72. Side walls of the etched region 12a are adjacent to the boron-added region 11a, and a bottom portion of the etched region 12a is in contact with the insulating layer 72.

Figure 9C:
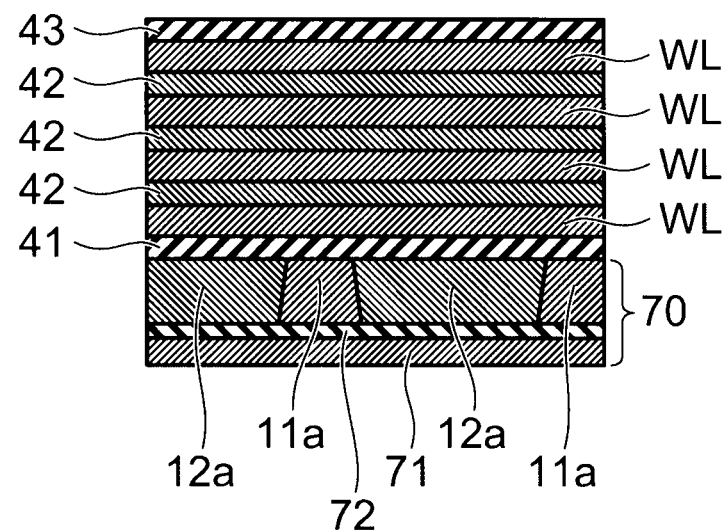

Next, as shown in FIG. 9C, after forming an insulating film 41 on the boron-added region 11a and the etched region 12a, a stacked body including the plurality of layers of electrode layers WL is formed on that.

Figure 10A:
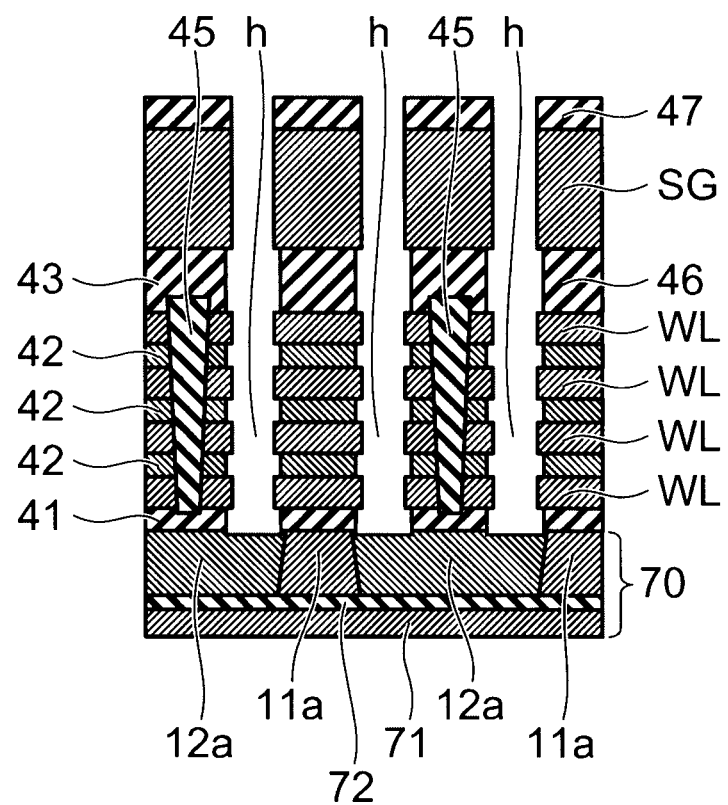

Since then, processes similar to the first embodiment proceed, and as shown in FIG. 10A, holes h are formed in the stacked body on the underlying layer 70. Lower ends of the holes h reach the etched region 12a and the bottom portions of the holes h are exposed to the etched region 12a. So as to sandwich the insulating film 45 positioned approximately at the center of the etched region 12a, a pair of holes h are positioned on the etched region 12a.

Next, the etched region 12a is removed by wet etching. As an etching solution at this time, an alkaline chemical solution, such as a KOH (potassium hydroxide) solution, for example, is used.

Figure 10B:
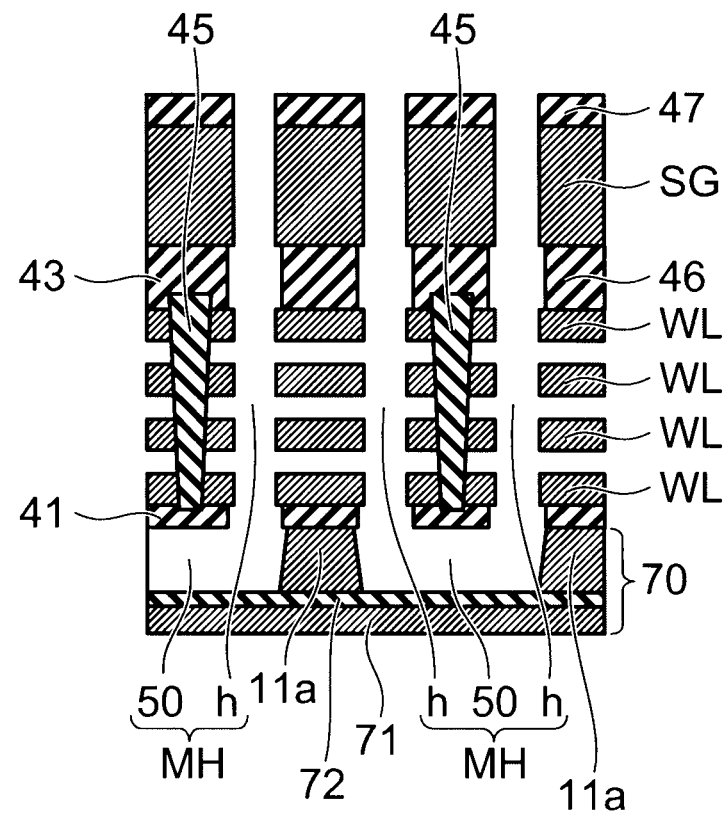

Thereby, the etched region 12a is removed as shown in FIG. 10B. Furthermore, at this time, the non-doped silicon layers 42 of non-doped silicon, which is the same as the etched region 12a, are also removed.

During this etching, the boron-added region 11a, the electrode layers WL, and the selection gate SG are not removed, which contain boron concentrations higher than boron concentrations in the etched region 12a and the non-doped silicon layers 42.

Furthermore, in order to selectively remove the etched region 12a while firmly suppressing the etching in the boron-added silicon layer 11 and the boron-added region 11a, it is preferred that the boron concentration in the boron-added region 11a is not less than $10^{20}$ atom/cm$^3$.

In addition, in the embodiment, the insulating layer 72 is formed under the etched region 12a. The insulating layer 72 is made from silicon oxide which is a substance different from silicon. The etching selectivity of silicon and silicon oxide for an alkaline chemical solution is high, and thus the etching in the depth direction of the etched region 12a can be stopped firmly by the insulating layer 72.

By the removal of the etched region 12a, as shown in FIG. 10B, depression parts 50 are formed in the underlying layer 70. The circumference of the depression parts 50 is surrounded by the boron-added region 11a, and under the depression parts 50, the insulating layer 72 exists.

Per one depression part 50, a pair of holes h are connected. That is, each lower end of a pair of holes h is connected to one common depression part 50 to form one U-shaped memory hole MH.

Figure 11A:
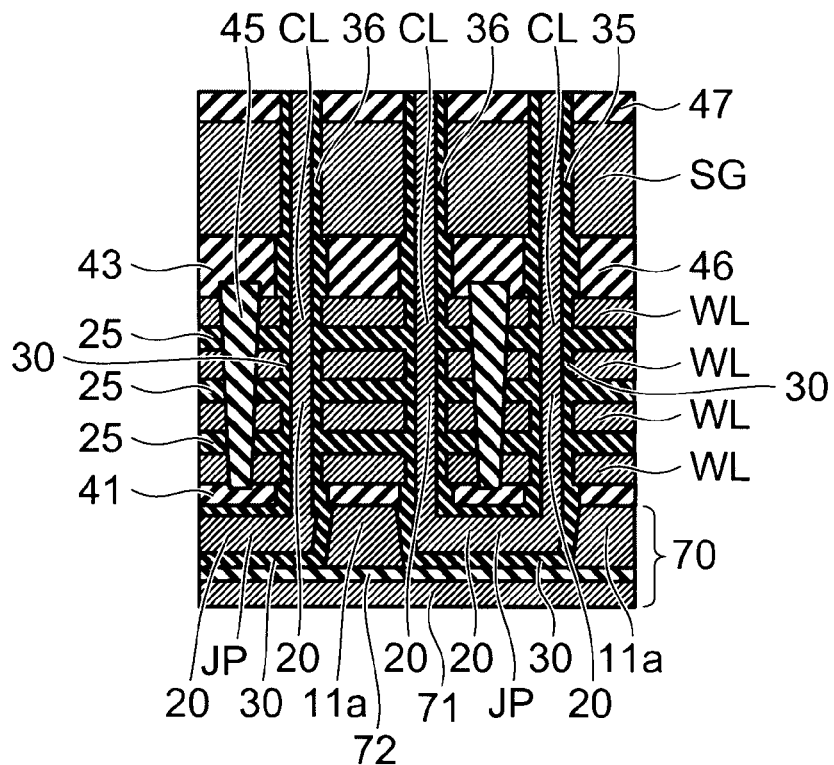

After forming the memory holes MH, processes proceed in the same way as in the first embodiment. That is, as shown in FIG. 11A, the insulating layers 25 are formed between the electrode layers WL, and further on inner walls of the memory holes MH, the insulating films 30 including the charge storage film 32 described above are formed. Moreover, on side walls of the memory holes MH in which the selection gate SG is exposed, the gate insulating films 35 and 36 are formed.

Furthermore, inside the insulating films 30 and the gate insulating films 35 and 36 in the memory holes MH, a silicon film as the channel body 20 is formed. After that, by overall etching, a surface of the insulating film 47 is exposed.

Figure 11B:
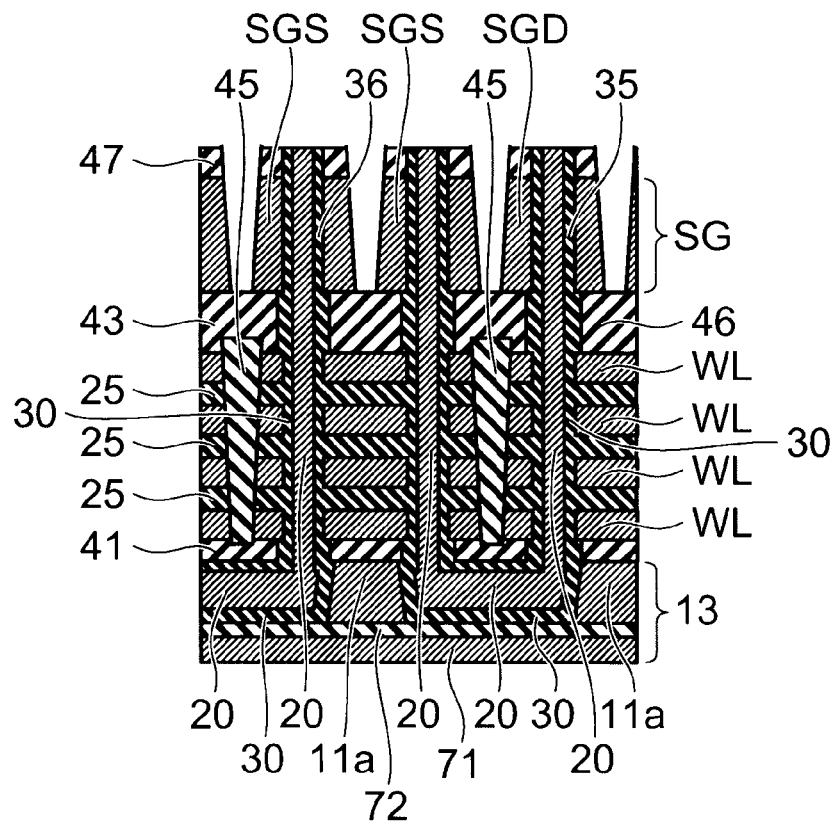

Next, by photolithography and etching, as shown in FIG. 11B, grooves reaching the insulating film 46 are formed in the insulating film 47 and the selection gate SG. Thereby, the selection gate SG is divided into the drain side selection gates SGD and the source side selection gates SGS. Moreover, after that, a contact electrode not shown, the source line SL and the bit lines BL shown in FIG. 1, and the like are formed.

In the first and second embodiments, also under the joint part JP at the lower ends of the memory strings, the boron-added silicon layer 11 also exists, which is the back gate BG. In the third embodiment, only on the circumference of the joint part JP, the boron-added region 11a that is the back gate BG exists.

Also in the third embodiment, as shown in FIGS. 9A and 9B, by selective ion implantation, two regions (the boron-added region 11a and the etched region 12a) with relatively different boron concentrations, that is, relatively different etching rates are made separately in the underlying layer 70. Therefore, the processes are unnecessary, such as dry etching of the underlying layer, film formation of the sacrifice film, and flattening of the underlying layer by removing the unnecessary sacrifice film, which allows the decrease in the number of processes for cost reduction.

Furthermore, also in the third embodiment, since there is no process of removing the unnecessary sacrifice film, the underlying layer surface does not leave a difference in level and no difference in level is formed in the electrode layers WL stacked thereon. This allows the stabilization of electrical properties of the memory cell transistors.

According to at least one embodiment described above, a region to be removed by subsequent wet etching through a hole penetrating the stacked body and a region to be left are made separately in the underlying layer by ion implantation. Then, through the utilization of the fact that an etching rate of an alkaline chemical solution for silicon depends on the boron concentration (hole concentration), a region with a relatively low boron concentration is selectively removed to thereby form U-shaped memory holes. Thereby, the number of processes carried out with respect to the underlying layer before forming the stacked body including the electrode layers can be decreased for cost reduction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:
    selectively implanting an impurity into an underlying layer containing silicon using a mask to form a boron-added region and a region adjacent to the boron-added region, the boron-added region containing boron, a boron concentration of the region adjacent to the boron-added region being lower than a boron concentration in the boron added region;
    forming a stacked body including a plurality of layers of electrode layers on the underlying layer;
    forming a pair of holes reaching the region adjacent to the boron-added region in the stacked body;
    forming a depression part connected to a lower end of each of the pair of holes in the underlying layer by removing the region adjacent to the boron-added region through the holes using an etching solution;
    forming an insulating film including a charge storage film on a side wall of the holes and on an inner wall of the depression part; and
    forming a channel body inside the insulating film.

2. The method according to claim 1, wherein
    the underlying layer includes a non-doped silicon layer,
    boron is selectively implanted into the non-doped silicon layer using the mask,
    the boron-added region is formed in a region into which the boron has been implanted, and
    the region adjacent to the boron-added region is formed in a region into which the boron has not been implanted by covered with the mask.

3. The method according to claim 2, wherein
the underlying layer further includes a boron-added silicon layer provided under the non-doped silicon layer, and the boron-added silicon layer with a boron concentration higher than a boron concentration in the region adjacent to the boron-added region is formed under the region adjacent to the boron-added region.

4. The method according to claim 3, wherein the boron-added region is formed all over a thickness direction of the non-doped silicon layer and is connected to the boron-added silicon layer.

5. The method according to claim 3, wherein a side wall of the region adjacent to the boron-added region is adjacent to the boron-added region and a bottom portion of the region adjacent to the boron-added region contacts the boron-added silicon layer.

6. The method according to claim 2, wherein the region adjacent to the boron-added region is removed using an alkaline chemical solution as the etching solution.

7. The method according to claim 3, wherein a boron concentration in the boron-added region and the boron-added silicon layer is not less than $10^{20}$ atom/cm$^3$.

8. The method according to claim 1, wherein
    the underlying layer includes a boron-added silicon layer,
    phosphorus is selectively implanted into the boron-added silicon layer using the mask,
    the region adjacent to the boron-added region is formed in a region into which the phosphorus is implanted, and
    the boron-added region is formed in a region into which the phosphorus is not implanted by covered with the mask.

9. The method according to claim 8, wherein the boron-added silicon layer with a boron concentration higher than a boron concentration in the region adjacent to the boron-added region is formed under the region adjacent to the boron-added region.

10. The method according to claim 8, wherein a side wall of the region adjacent to the boron-added region is adjacent to the boron-added region and a bottom portion of the region adjacent to the boron-added region contacts the boron-added silicon layer.

11. The method according to claim 8, wherein the region adjacent to the boron-added region is removed using an alkaline chemical solution as the etching solution.

12. The method according to claim 8, wherein a boron concentration in the boron-added region and the boron-added silicon layer is not less than $10^{20}$ atom/cm$^3$.

13. The method according to claim 1, wherein
    the underlying layer includes an insulating layer and a silicon layer provided on the insulating layer,
    the boron-added region and the region adjacent to the boron-added region are formed in the silicon layer, and
    a bottom portion of the region adjacent to the boron-added region reaches the insulating layer.

14. The method according to claim 13, wherein the silicon layer is a non-doped silicon layer and the insulating layer is a silicon oxide layer.

15. The method according to claim 13, wherein the boron-added region is formed all over a thickness direction of the non-doped silicon layer and a bottom portion of the boron-added region reaches the insulating layer.

16. The method according to claim 13, wherein the region adjacent to the boron-added region is removed using an alkaline chemical solution as the etching solution.

17. The method according to claim 13, wherein the boron concentration in the boron-added region is not less than $10^{20}$ atom/cm$^3$.

* * * * *